United States Patent
Tyson et al.

(10) Patent No.: US 7,663,066 B2
(45) Date of Patent: *Feb. 16, 2010

(54) PROCESS FOR CREATING A DURABLE EMI/RFI SHIELD BETWEEN TWO OR MORE STRUCTURAL SURFACES AND SHIELD FORMED THEREFROM

(75) Inventors: Kenneth E. Tyson, Fair Oaks, CA (US); Deborah S. Tyson, Fair Oaks, CA (US); Theodore Marzan, Sacramento, CA (US); Ronald B. Walker, Loomis, CA (US)

(73) Assignee: Proteus Technical Solutions, Inc., Rancho Cordova, CA (US)

( * ) Notice: Subject to any disclaimer, the term of this patent is extended or adjusted under 35 U.S.C. 154(b) by 24 days.

This patent is subject to a terminal disclaimer.

(21) Appl. No.: 11/924,032

(22) Filed: Oct. 25, 2007

(65) Prior Publication Data

US 2008/0257598 A1    Oct. 23, 2008

Related U.S. Application Data

(60) Continuation of application No. 11/446,442, filed on Jun. 1, 2006, now Pat. No. 7,307,223, which is a division of application No. 10/360,528, filed on Feb. 7, 2003, now Pat. No. 7,063,767.

(60) Provisional application No. 60/355,130, filed on Feb. 8, 2002.

(51) Int. Cl.
  *H05K 9/00* (2006.01)
(52) U.S. Cl. .................. 174/372; 174/377

(58) Field of Classification Search .............. 174/371, 174/372, 377; 361/816, 818, 800
See application file for complete search history.

(56) References Cited

U.S. PATENT DOCUMENTS

| | | | |
|---|---|---|---|
| 4,965,408 A | 10/1990 | Chapman et al. | |
| 5,170,009 A | 12/1992 | Kadokura | |
| 5,210,373 A | 5/1993 | Weber | |
| 5,532,427 A | 7/1996 | Stoyko | |
| 5,595,801 A | 1/1997 | Fahy et al. | |
| 5,646,369 A | 7/1997 | Miska et al. | |
| 5,656,795 A | 8/1997 | Miska | |
| 5,981,871 A | 11/1999 | Trumble et al. | |
| 6,111,192 A | 8/2000 | Bell et al. | |
| 6,303,854 B1 * | 10/2001 | Papaleo et al. | 174/382 |
| 2004/0047103 A1 * | 3/2004 | Schmidt et al. | 361/118 |
| 2007/0107350 A1 * | 5/2007 | Surace et al. | 52/461 |

\* cited by examiner

*Primary Examiner*—Hung V Ngo
(74) *Attorney, Agent, or Firm*—John P. O'Banion

(57) ABSTRACT

A method for producing a durable electromagnetic and radio frequency interference shield between two or more structural members of a wall or enclosure and a shielded shelter produced using the method. In one embodiment, joints between structural members are preferably filled with an electrically conductive filler. A base coat of a metal spray that adheres well to the filler and structural member is then applied. At least one layer of a metal spray with magnetic field attenuation properties such as steel, and at least one layer of a metal spray that has plane wave attenuation properties such as tin are applied to the base coat. Optionally, a coat of protective or conductive paint is then applied to the top surface of the metal spray layers. An enclosure with shielded joints according to the present invention has superior shielding capability and durability over the art.

3 Claims, 5 Drawing Sheets

PROCESS FOR CREATING A DURABLE EMI/RFI SHIELD BETWEEN TWO OR MORE STRUCTURAL SURFACES AND SHIELD FORMED THEREFROM

CROSS-REFERENCE TO RELATED APPLICATIONS

This application is a continuation of U.S. application Ser. No. 11/446,442, filed on Jun. 1, 2006, incorporated herein by reference in its entirety, now U.S. Pat. No. 7,307,223, which is a divisional application of U.S. application Ser. No. 10/360,528, filed on Feb. 7, 2003, now U.S. Pat. No. 7,063,767, incorporated herein by reference in its entirety, which claims priority from U.S. provisional application Ser. No. 60/355,130, filed on Feb. 8, 2002, incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Field of the Invention

This invention pertains generally to EMI/RFI penetration resistant structural materials, and more particularly to a process for creating a durable EMI/RFI shield between two or more adjacent metal surfaces.

2. Description of Related Art

Many household, industrial, commercial and military electronic devices are susceptible to interference by electromagnetic and radio frequency radiation sources in their surrounding environment. A radio frequency circuit, for example, often requires shielding to prevent electromagnetic energy generated by the circuit from interfering with the circuit or with the operation of adjacent electronic devices. Likewise, in military applications, sophisticated communications, command and logistical equipment are vulnerable to electromagnetic interference in battlefield settings. Both enemy and friendly sources of electromagnetic interference may disrupt sensitive equipment rendering it temporarily or permanently inoperative. Natural or man-made electromagnetic pulses may also significantly disrupt equipment.

Additionally, electromagnetic sources created by certain equipment may also be intercepted and used by an enemy to locate the radiation source. Similarly, transmitted communications and unencrypted data that is radiating within an enclosure or room may be intercepted by an enemy or a corporate spy allowing a loss of private or essential information. Therefore, it is essential that any enclosure or room that houses sensitive equipment or systems provide a shield to protect the equipment from damage or thwart the compromise and loss of vital information.

Electromagnetic interference (EMI) can occur at frequencies anywhere along the electromagnetic spectrum. The radio frequency part of the electromagnetic spectrum is normally considered to include the range of between 10 kilohertz (KHz) and 10 gigahertz (GHz) and is included in the term electromagnetic radiation. Radio frequency interference (RFI) and electromagnetic interference (EFI) are use interchangeably herein.

A wire or a trace on a printed circuit board, for example, can act as an emitter of electromagnetic interference by the action of moving a current through the wire that creates an electromagnetic field. A wire or trace may also act as a receptor of electromagnetic interference by exposure to an electromagnetic field. Consequently, the enclosures of sensitive electronic devices preferably shield the circuitry from outside electromagnetic interference (EMI) by either reflecting or absorbing the electromagnetic energy so that the energy in the environment surrounding the electronic devices remains at acceptable levels.

One generally known EMI/RFI shield is a housing that is electrically conductive and is electrically grounded. Current is caused to flow in a conductive barrier when exposed to an electromagnetic force field. When the electromagnetic field penetrates the conductive barrier, the current is attenuated e.g. reduced in amplitude in what is known as the skin effect. The current flow in the barrier is approximately equal to twice the magnetic field strength incident to the barrier when the field is perpendicular to the barrier and is called the surface current density. Surface current density is typically measured in amps/meter. It has also been shown that the power of the electromagnetic field as it leaves the conductive barrier is approximately equal to the impedance of the barrier times the square of the current. The power is usually determined in watts per meter squared. Accordingly, electromagnetic radiation emanating from the inside or the outside of the housing is absorbed by the conductive material and dissipated through the ground and away from the sensitive electronic components thereby permitting the proper operation of the electronic equipment.

However, one deficiency with such shields is that the electrical currents created in the conductive material of the housing can be disrupted by gaps between panels or around access doors and the like and can hinder the conduction of the EMI energy to the ground. Such gaps may lead to leakage EMI energy through the shield. In some circumstances, the gaps may act like slot antennas resulting in the shield becoming a secondary EMI source. This is due to the fact that a voltage is created across the seam that is approximately equal to the current times the impedance of the seam. Reducing the impedance of the seam through the use of gaskets or the like may reduce the power radiating from the seam.

Shelters and other enclosures of electronic equipment have also been developed to provide EMI shielding for military and civilian electronic equipment. For example, an EMI shielded shelter is described in U.S. Pat. No. 6,111,192 that is collapsible for easy transport. Such shelters are typically designed to fit on the back of a truck for mobility. However, such shelters may also experience electromagnetic leakage through the joints between panels, doors, hatches and other access ways. The overall capacity of the shelter to shield electromagnetic interference can be reduced by leakage through seams between panels.

Another deficiency in the EMI shields known in the art is that the overall shielding capacity of the shelter degrades over time. This degradation is particularly apparent with shelters that are regularly transported or exposed to severe weather conditions and temperature fluctuations.

Therefore, there is a need for an EMI/RFI shield or shelter that efficiently protects sensitive electronics from interference and effectively eliminates leakage between the panels or sections of the shield. The present invention satisfies that need, as well as others, and overcomes deficiencies found in prior methods and structures.

BRIEF SUMMARY OF THE INVENTION

The present invention generally comprises an EMI/RFI shield including two or more adjacent structural surfaces as well as a method for producing the shield. It can been seen that seams and joints in an EMI/RFI shelter, for example, may limit the shielding capability of the shelter when exposed to a radiated electromagnetic field.

Seams may allow the electromagnetic interference fields to bypass or be transmitted through the shield thereby limiting the overall capability and effectiveness of the shield. The impedance of the seam or joint must therefore be minimized, preferably near zero.

By way of example, and not of limitation, in accordance with one aspect of the invention an enclosure is provided that has base structural walls with joints that are preferably filled with conductive filler. The structural members of the enclosure preferably have applied a bonding layer, at least one layer with magnetic field attenuation properties and at least one layer with plane wave attenuation properties.

According to another aspect of the invention, the seams between adjacent structural members are bridged with the bonding, magnetic field and plane wave attenuation layers thereby providing a shield even if those layers later separate from the surface of the seam or filler.

Generally, the preferred method of the invention for providing an EMI/RFI shield comprises providing a base structure and applying a bond coat of a conductive metal spray to the base structure. A coat of a second conductive metal spray is then applied to the bond coat and then a coat of a third conductive metal spray is applied to the second coat. The layers of metal spray may be applied to the interior of the enclosure, the exterior of the enclosure, or a combination of the interior and exterior of the enclosure.

The preferred base structure is aluminum or aluminum alloy sheets for use in transportable structures. The sheets may also be sandwich sheets with a honeycomb or foam core. While aluminum is preferred for weight, corrosion and cost considerations, other metals, alloys and non-metal composite materials may also be used.

By way of example and not of limitation, the bond coating step is carried out by applying a base or bond coat of a preferably conductive metal spray. The preferred bond coat comprises a coat of molybdenum or other metal that provides a good tensile bond with aluminum base material. The bond coat is preferably approximately 2 millimeters at a minimum.

The second layer is preferably a metal spray of a second metal applied to the bond coat in one embodiment. The second metal spray is preferably steel or a steel alloy. The steel spray is preferably between approximately 2 and 10 millimeters thick. While steel is preferred other metals with magnetic field attenuation properties may also be used.

The outer layer is preferably a third metal applied by spraying over the second metal layer. The preferred outer layer is tin or 80%/20% tin/zinc alloy. Tin or a tin alloy is preferred because it provides plane wave attenuation properties and a protective coat to the under layers. While the sequence of steel and tin or tin/zinc spray applications is preferred, it will be understood that any sequence magnetic field and plane wave attenuating spray layers may be employed. Furthermore, the base structural member, for example, may also separate the layers by one layer being applied to the interior of the structure and one layer being applied to the exterior.

In another embodiment, seams and imperfections are filled with a conductive filler such as steel powder impregnated epoxy. The bond coat is then sprayed over the filler. If the coverage of the bond coat is satisfactory, then at least one coat of a second metal is applied to the bond coat and a coat of a third metal is applied to the second coat as described previously.

If the bond coat is unsatisfactory due to poor adhesion or coverage, an intermediate layer of a metal is applied to the bond layer in this embodiment. The intermediate layer is preferably a coat of tin or tin alloy metal spray. While tin is preferred, other metal sprays including another coat of the bond metal spray may be used. The steel layer and outer tin layer are applied to the intermediate layer in this embodiment.

In another embodiment, the outer metal layer receives an optional outer coat of a urethane; elastomeric coating or paint to provide some protection from scrapes and impacts. In another embodiment, the paint is a conductive paint to further enhance the EMI/RFI shielding capability of the shelter.

Therefore, according to an aspect of the invention an EMI/RFI shield is formed between two or more adjacent metal surfaces by bridging the adjacent metal surfaces using a metal spray material. Another aspect of the invention is to minimize flexure in the bridge of the metal spray material. A still further aspect of the invention is to clean the adjacent metal surfaces prior to applying the metal spray material. Another aspect of the invention is to fill any irregularities between adjacent metal surfaces with an adhesive material having conductive properties after the cleaning step.

An object of the invention is to provide an electrically conductive EMI/RFI shielding between two or more adjacent metal surfaces that is durable and has low resistance.

Another object of the invention is to provide a method for forming an EMI/RFI shield on a housing or shelter of electronic equipment that can be applied to metal or non-metal substrates.

Still another object of the invention is to provide a shelter that is effectively resistant to the penetration of electromagnetic interference that is has a shield that is resistant to fatigue, chipping and cracking.

A further object of the invention is to provide a shelter that is readily transportable and resistant to a wide range of electromagnetic interferences.

According to another object of the invention, an EMI/RFI shield is provided that is durable and resistant to shock, vibrations and severe weather conditions and still maintain performance and has a corrosion resistant outer coating.

Further objects and advantages of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings that are for illustrative purposes only:

DETAILED DESCRIPTION OF THE INVENTION

Referring more specifically to the drawings, for illustrative purposes the present invention is embodied in the method and apparatus generally depicted in FIG. 1 through FIG. 5. It will be appreciated that the apparatus may vary as to configuration and as to details of the parts, and that the method may vary as to the specific steps and sequence, without departing from the basic concepts as disclosed herein.

Figure 1:
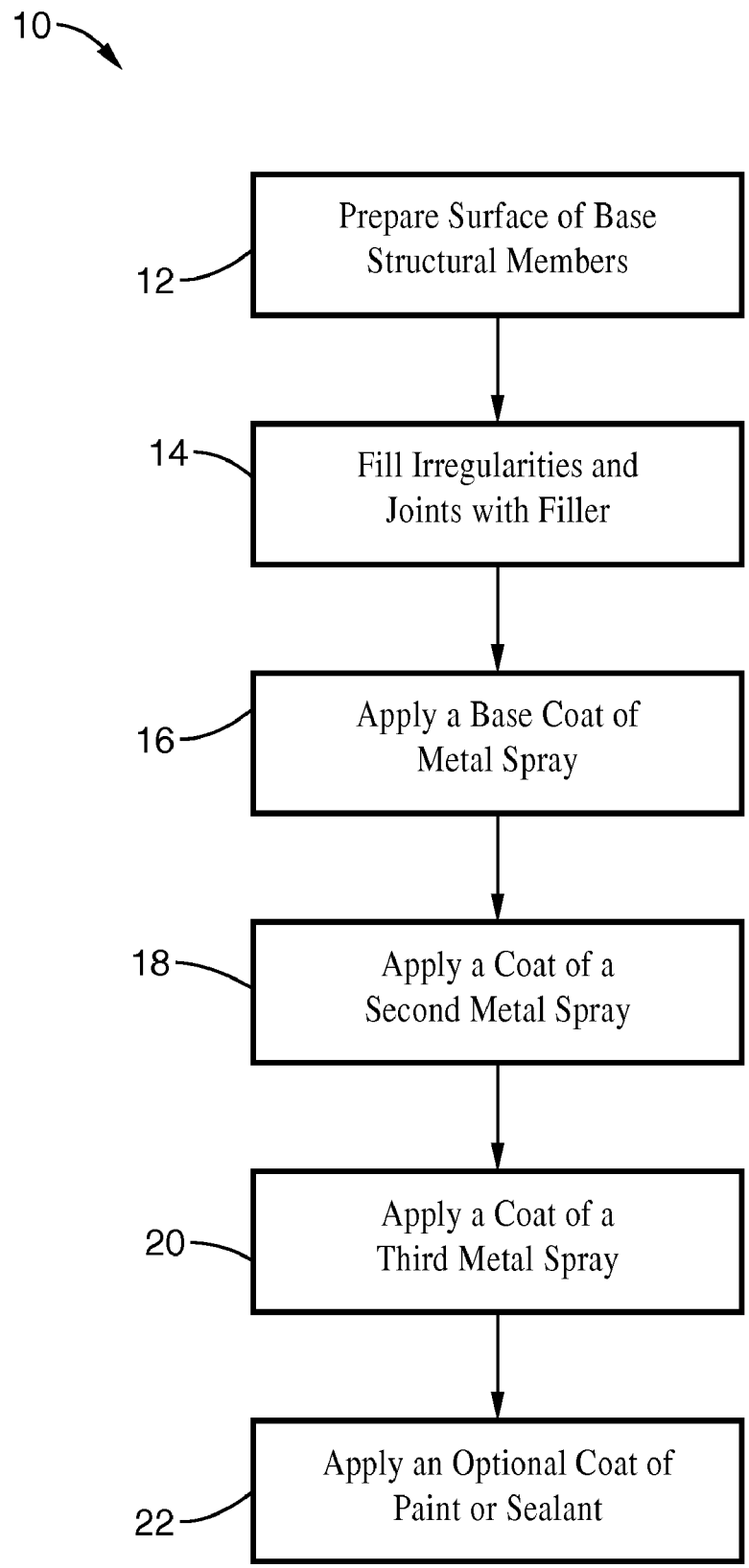
FIG. 1 is a flow diagram showing generally the method steps of one embodiment of a method of providing a durable EMI/RFI shield between two or more surfaces according to the present invention.

Turning now to FIG. 1, a flowchart of the preferred embodiment of the method 10 for providing a durable EMI/RFI shield between two adjacent structural surfaces is shown. The structural materials that are particularly suitable for use with the method are materials that are shown to exhibit resistance to electromagnetic interference penetration. Typically, metal or metal alloy sheets of varying cross sectional thickness may be used. However, sheets of non-metal composite material may also be used with the method. The materials may be single sheets, two or more sheets and a frame/core structure forming sandwich panels, or two or more sheets and a frame structure forming panels. Additionally, any cutout or penetration made to the enclosure to allow signal, power, or air can utilize this technique between the sheet skin and the corresponding cutout panel.

At block 12, the surfaces of the two panels or other structural members are prepared. The surfaces are prepared by removing any paints, primers, adhesives or other foreign materials from the surfaces of the panels. In addition, any oxidation or other metal reactant products and contaminants should be removed from the surfaces. The surfaces may be prepared, for example, by sanding, sandblasting, grinding, wire brushing or exposing the surfaces to solvents to remove the contaminants. It will be understood that the preparation step may be a single step or a series of steps depending on the nature of the surface contaminants and composition of the panel.

The edges of the joints between two or more adjacent surfaces are preferably machined so that the joints are precise. The joints of panels that are side by side are preferably sanded and planed so that panels are aligned and generally in the same plane. Although tight joints are preferred, it will be seen that imprecise joints can also be bridged using the process.

Sanding and solvent residue is preferably removed from the prepared surfaces by mechanical means such as forced air, vacuum or cloth and then thoroughly cleaned with isopropyl alcohol or other suitable solvent known in the art that will not react with the surface panel or applied materials or leave an appreciable residue.

Any irregularities of the prepared surfaces and the joints are then filled with a filler at block 14. In the preferred embodiment, the filler is electrically conductive and applied soon after the surface is prepared at block 12 so that oxidation or other reactions of the prepared metal surface will not occur.

The preferred filler is a particulate steel or other metal impregnated epoxy. However, other conductive or non-conductive fillers may be used. It is preferred that the filler be thermally stable and capable of exposure of up to approximately 400° F. The preferred filler should also be galvanically compatible with the structural members or the base coat of metal spray that is applied in step 16. Optionally, it is also preferred that the filler have a reasonable curing time of less than approximately twelve hours and a set up time of less than approximately two hours as well as being able to be applied in temperatures ranging from approximately 40° F. to approximately 100° F. The selected filler should also provide a suitable bonding surface for subsequent applications of spray.

Figure 3:
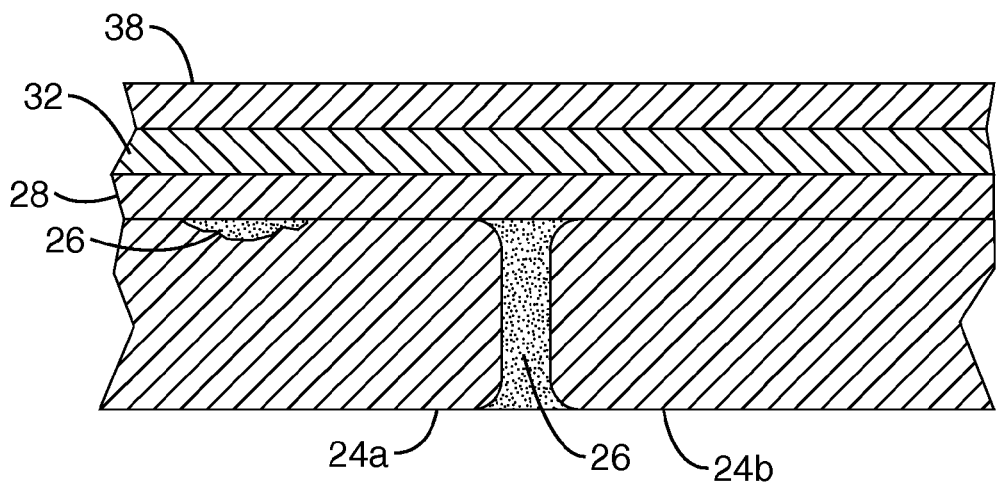
FIG. 3 is a cross sectional view of one embodiment of a durable EMI/RFI shield between two or more structural surfaces according to the present invention.
Figure 4:
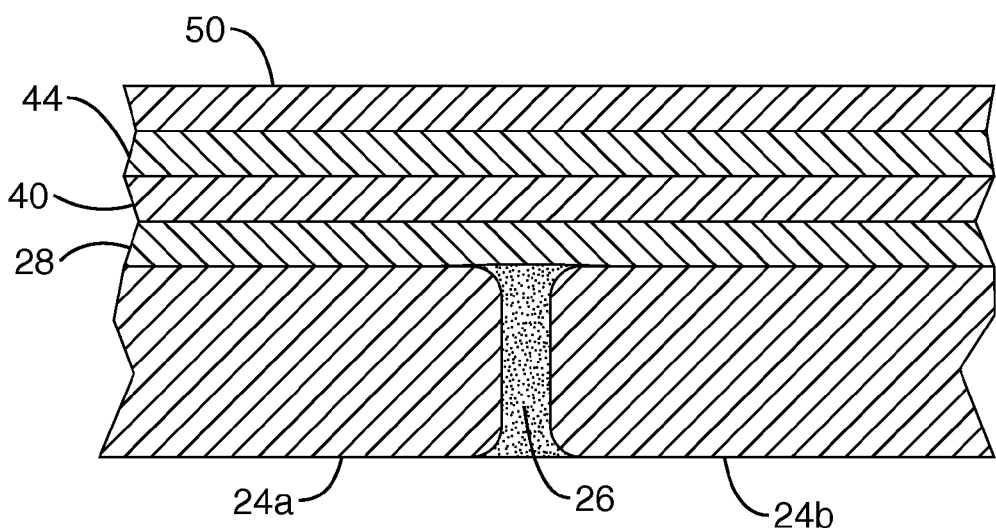
FIG. 4 is a cross sectional view of an alternative embodiment of a durable EMI/RFI shield according to the present invention.

After the filler has cured or dried, the filled areas are preferably sanded so that the surface is even and the surface of the filler is flush with the adjacent metal surfaces as shown in FIG. 3 and FIG. 4. In one embodiment, the filler is sanded to a slight taper to allow for slight misalignment of the surfaces of the structural members. Sanded surfaces that do not have any shadows or pits or irregularities are preferred so that an even bonding surface is provided for the application of the base metal spray at step 16.

The filled and sanded surface is further prepared by the removal of dust and other contaminants. Particle removal may be accomplished with the use of forced air, vacuum or by wiping the surface with a cloth. Thereafter, the surface may be cleaned thoroughly with the application of isopropyl alcohol or other solvent that leaves no appreciable residue and will not react with the materials.

At block 16, a base coat of a metal spray is applied to the filled and prepared surfaces. The preferred minimum thickness of the base coat is between approximately 2 millimeters and approximately 3 millimeters. The base coat is preferably applied at block 16 shortly after the surface is sanded and prepared to avoid oxidation of the surfaces before the application of the base coat. In one embodiment, the base coat is not required to adhere or completely adhere to the filler as long as the base coat of metal spray adheres to the surfaces surrounding the filler.

The preferred base coat metal spray is 99% pure molybdenum for base surface substrates made of aluminum or alloys of aluminum. Although pure molybdenum is preferred, it will be understood that alloys of molybdenum or other metals may be used as a base spray that is preferably selected by the ability of the material to adhere and provide a good tensile bond to the structural panel or by the ability of the material to provide a foundation for a second metal spray selected for application at block 18. For example, suitable alternative bond coat materials include, but are not limited to aluminum/nickel/molybdenum alloys and nickel/aluminum alloys. Aluminum/bronze and aluminum/bronze/nickel alloys are less preferred in applications that will be used in humid weather conditions due to the potential for corrosion.

Any dust or over-spray particles from the base coat of metal spray are preferably removed with forced air or vacuum. Any contamination of the sprayed surface by oils or other contaminants from the hands or compressed air for example is preferably avoided.

At block 18, a second metal spray coat is applied to the base coat of metal spray. The coat of a second metal spray is preferably applied within approximately one hour of completion of the base coat to avoid exposing the surfaces to contaminants as well as denying the opportunity for oxidation of the base coat.

Once the coat of a second metal spray is applied, any spray particles that have not adhered to the previous coat and other contaminants are removed, preferably by forced air or vacuum. Liquid contaminants such as oil should also be avoided because these contaminants may interfere with the adhesion of subsequent coats of metal spray. In one embodiment, the second metal spray layer comprises .80C steel because steel provides good magnetic and some plane wave attenuation capability. While high carbon steel is preferred, it will be understood that any iron or steel alloy with good magnetic impermeability properties will be a candidate material for a metal spray layer.

A third metal spray is applied at block 20 in the embodiment shown. The metal used for the third metal spray is preferably a metal that is environmentally inert to avoid oxidation and provide protection to the underlying coats as well as provide additional plane wave attenuation. In one embodiment, the selection of the metals of the base coat, the second metal coat and the third metal spray coat is made by optimizing the thermal expansion, bond strength and magnetic and galvanic coupling properties of each metal. Materials with closely matched thermal expansion coefficients, for example, will avoid temperature type cycling fatigues and the EMI/RFI attenuation capability of the panels and joints will not degrade over time.

Optionally, at block 22, one or more coats of a conductive paint can be applied to the surface of the panels and joints to enhance the overall EMI/RFI shielding performance of the panels. Alternatively, an outer protective coat of non-conducting polyurethane with pigments may be applied to the exterior of the panels or structural members. Top surface coatings preferably provide some protection to the layers of metal spray from scuffs and other impacts that may compromise the integrity of the metal spray layers.

Figure 2A:
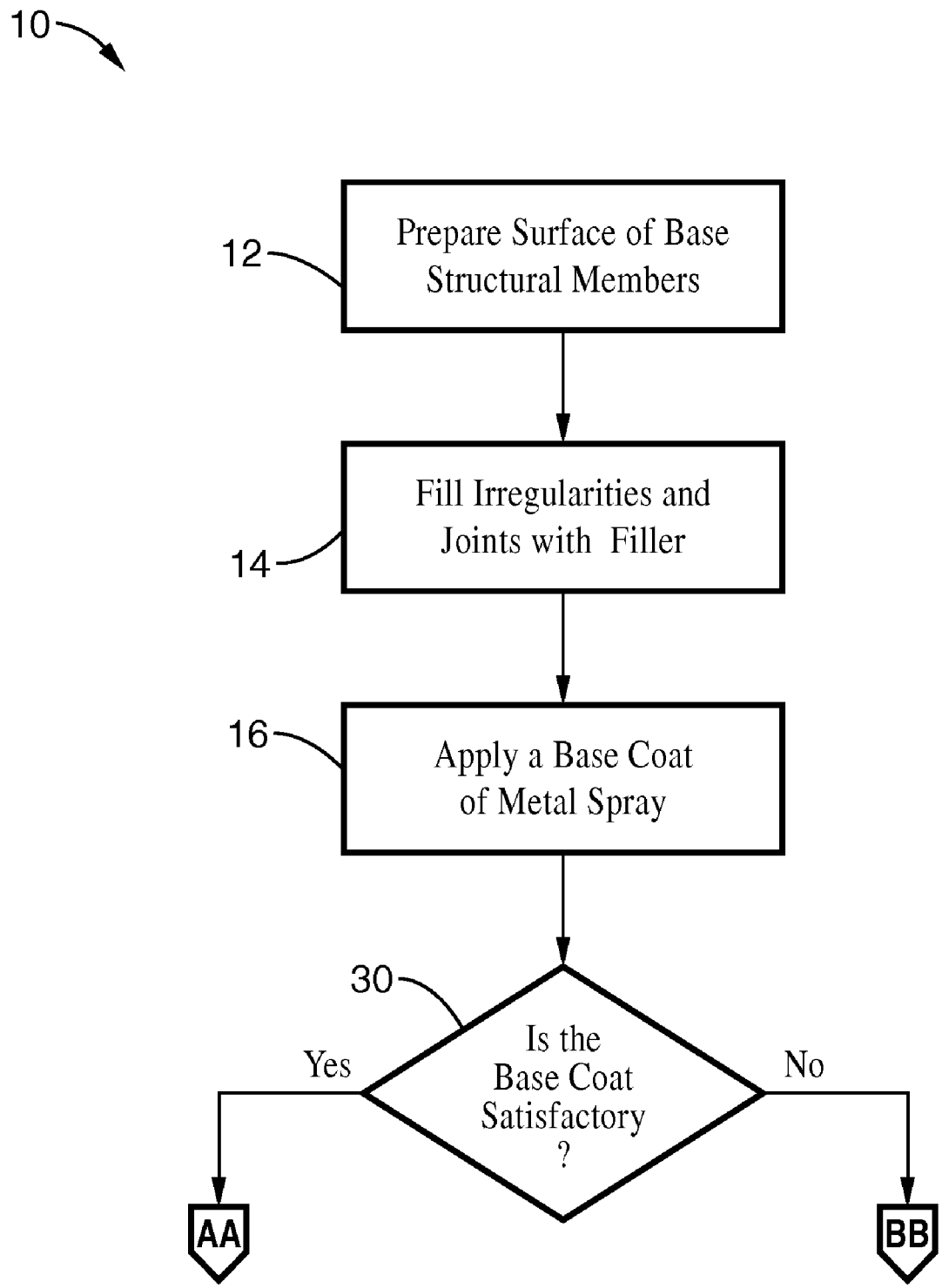
FIG. 2A and FIG. 2B is a flow diagram showing generally the method steps of an alternative embodiment of a method of providing a durable EMI/RFI shield between two or more structural surfaces according to the present invention.
Figure 2B:
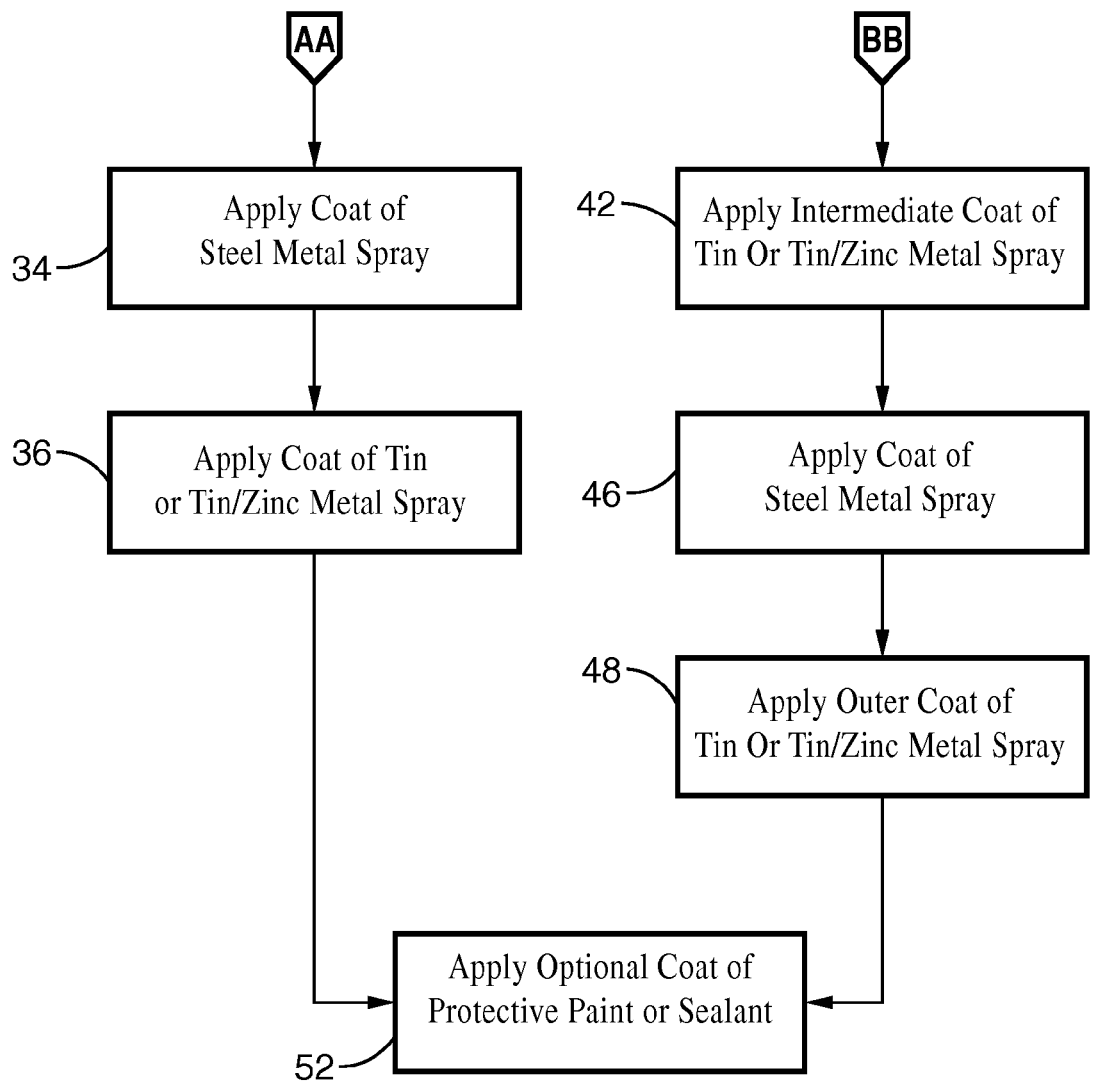

Turning now to FIG. 2A and FIG. 2B, there is shown a flow diagram that generally outlines the steps of a second embodiment of the present invention. Referring also to FIG. 3 and FIG. 4, the second embodiment, adapted to metal panels such as those made of aluminum or aluminum alloys, is shown in cross-sectional views.

Figure 5:
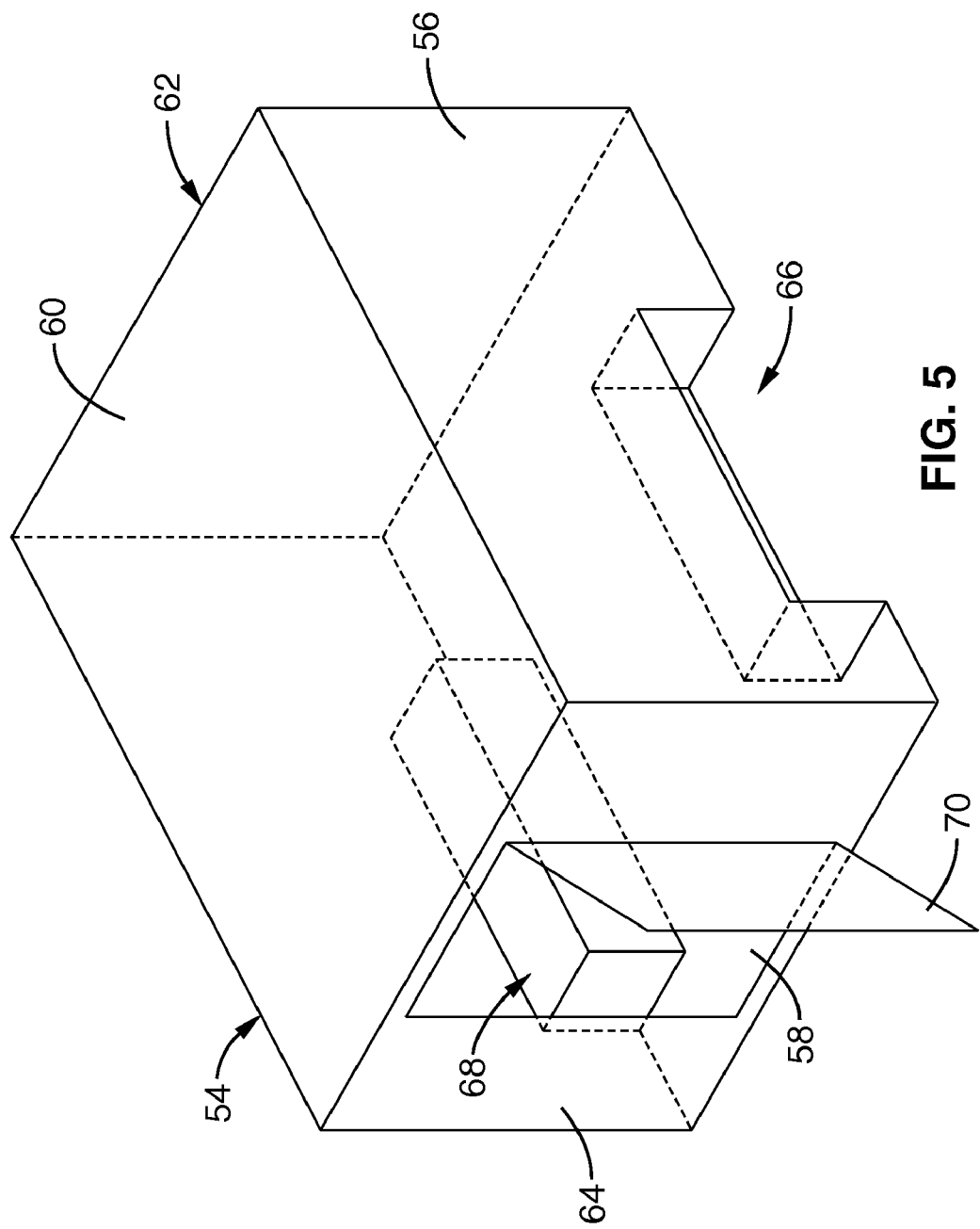
FIG. 5 is a perspective view of one embodiment of an EMI/RFI shelter according to the present invention adapted to be transported by a vehicle.

The metal panel or structural members 24a, 24b shown in FIG. 3 and FIG. 4 are typically sandwich panels of aluminum skins with a non-metallic honeycomb core. The core is usually composed of paper or Nomex® honeycomb but may also be foam. The thickness of the sandwich panel is preferably approximately 1.26 inches but may vary from 1 to 3 inches in the typical shelter application. The skin thickness typically ranges from approximately 0.016 inches to 0.063 inches with a thickness of approximately 0.025-0.032 inches being preferred for use with a shelter, such as shown in FIG. 5.

With other applications, the metal panels 24 may be single sheets or sandwich panels of essentially any thickness. The metal panels 24 are typically perimeter welded together to form the desired structure. However, other methods of bonding panels known in the art such as adhesives may be used as well.

At block 12 of FIG. 2A, the surfaces of the structural members is prepared to remove any excess adhesives, paints, primers, welding residues, oxidation and the like that may interfere with the adhesion of a base coat of metal spray or fillers.

The surface is preferably cleaned with isopropyl alcohol to remove surface contaminants and particulate matter from the surface of the metal panels 24a, 24b.

A steel particulate impregnated epoxy conductive filler 26 is then placed into irregularities and joints of the panels or structural members as shown at step 14 of FIG. 2A. While steel particulate impregnated epoxy is preferred, other metal particles and other adhesives and fillers may be used. Once the filler 26 has had sufficient time to cure, the filled areas are preferably sanded or otherwise machined to a level with the planes of the panels or structural members. Particulate matter is then removed from the surfaces with pressurized air or vacuum and then the surfaces are cleaned with a solvent, preferably isopropyl alcohol, to remove any remaining contaminants including oxidants.

At block 16 of FIG. 2A, a base coat of a metal spray 28 is applied to the prepared surfaces of the panels 24a, 24b. The preferred metal spray of the base coat 28 is approximately 99% pure molybdenum, selected because of its ability to form strong bonds with the aluminum panels and to the preferred metal impregnated filler material. Although molybdenum is preferred, other metals or metal alloys that can form good bonds with aluminum can be used as a base coat. For example, Nickel/Aluminum/Molybdenum and Nickel/Aluminum may be used. An evenly applied base coat of between approximately 2 millimeters and approximately 3 millimeters is preferred. The base coat is then exposed to forced air or a vacuum to remove any particulate matter and then inspected.

At question block 30, the results of the inspection of the base coat determine whether the base coat is satisfactory. The base coat will be considered satisfactory if there is an even coat over the panels and the metal spray has properly adhered to the filler at the seams etc. Sections of filler between two metal surfaces that are large will often have insufficient contacts with the base coat of metal spray and will create an area of weakness.

If the base coat is determined to be satisfactory at block 30, then a second layer of metal spray 32 is applied at the step at block 34 of FIG. 2B. FIG. 3 shows a cross section of the EMI/RFI shield if the base coat is determined to be satisfactory at block 30 of FIG. 2A. The second layer of metal spray is preferably .80C steel evenly applied to a thickness of approximately 2 millimeters to approximately 10 millimeters. Steel layers of greater than approximately 10 millimeters are not preferred because of the propensity of the layer to peel, particularly when exposed to jolts or significant vibrations. While .80C steel is preferred, it will be understood that other carbon content steel or iron sprays and the like may be used that have magnetic attenuation properties. Additionally, .80C steel is also preferred because of its thermal expansion compatibility with mating materials, bond strength with the base coat and its magnetic and galvanic compatibility with the mating materials in this embodiment.

The coat of a second metal spray 32 shown in FIG. 3 is preferably applied within approximately one hour of the application of the base coat to avoid oxidation and contamination of the base coat. After application, any residual particulate matter on the second metal spray coat 32 is preferably removed with forced air or a vacuum.

Referring now to block 36 of FIG. 2, an outer coat 38 of a third metal spray is applied to the cleaned steel coat 32 shown in FIG. 3. The preferred outer coat of metal spray 38 is 99% pure tin or an 80%/20% tin/zinc alloy. The outer coat 38 is preferably sprayed to a thickness in the range of approximately 5 millimeters to approximately 80 millimeters. Thicker outer coats 38 are preferred for applications that intended for use as contact surfaces for removable panels, filters, etc. The additional thickness also allows for long term repetitive cleaning of the surface and protection against severe weather or other oxidation conditions. In addition, the outer coat of tin or tin alloy provides plane wave attenuation and thicker outer coats provide greater attenuation capability to the structure. While tin or tin alloys provide a durable protective coat as well as plane wave attenuation, it will be understood that other metals and alloys or materials that provide plane wave attenuation, and durability if necessary, that can be used as an outer coat.

While tin or tin/zinc alloys are preferred for the outer coat in the embodiment shown, other metals and metal alloys may be used as well. For example nickel metal and nickel metal alloys such as nickel/chrome as well as other tin alloys may be used.

If the base coat 28 is determined to be unsatisfactory upon inspection at block 30 of FIG. 2A, an intermediate coat of a second metal spray 40 is applied to the base coat 28 as shown at block 42 of FIG. 2B. The embodiment shown at FIG. 4 is one that is produced when the base coat is determined to be unsatisfactory at block 30. The intermediate coat of metal spray 40 is preferably composed of either 99% tin or an 80%/20% tin/zinc alloy. The intermediate metal spray 40 is preferably evenly applied in a thickness of between approximately 2 millimeters and 3 millimeters. Contaminants and particulate matter are then removed from the intermediate coat of spray 40 using preferably forced air or a vacuum.

A coat of a third metal spray 44 is then applied at block 46 of FIG. 2B to the intermediate coat of metal spray 40. In the embodiment shown in FIG. 4, the third metal spray is preferably .80C steel. The steel coat 44 is preferably of a thickness within the range of approximately 2 millimeters and approximately 10 millimeters evenly applied.

Layers greater that approximately 10 millimeters are not preferred because of the appearance of peeling in applications where the panels are exposed to harsh or rugged conditions.

At block 48 of FIG. 2B, the steel coat 44 is then coated with an outer coat 50 of a metal spray. The preferred outer coat of metal spray is 99% pure tin or an 80%/20% tin/zinc alloy, which gives the best combination of durability, corrosion protection and EMI/RFI shielding attributes. The preferred thickness of the outer coat of metal spray 50 is within the range of approximately 5 millimeters and approximately 80 millimeters depending on the intended use and the performance needs of the shield.

Optionally, one or more coats of paint or sealants can be applied to the outer coat of metal spray 50 and surface panels and joints as provided at block 52 of FIG. 2B. Conductive paints may also enhance the EMI/RFI shielding performance of the system. Alternatively, an outer protective coat of non-conducting polyurethane or elastomeric coating may be applied to the exterior of the panels or structural members. Top surface coatings preferably provide some protection to the layers of metal spray from scuffs and other impacts that may compromise the integrity of the metal spray layers.

Additionally, conductive and non-conductive paints may fill any pores or defects in the layers of metal spray and thereby restrict access of air and moisture to the lower spray levels and therefore the occurrence of corrosion and the like.

The applications of metal spray described in FIG. 1, FIG. 2A and FIG. 2B may be made to the interior or to the exterior surfaces of the enclosure or a combination of both. In one embodiment, bond coats, magnetic attenuation coats and plane wave attenuation coats of metal sprays are applied to both the interior and exterior surfaces of the structural members.

Although single spray layers in a particular sequence are illustrated in FIG. 1 through FIG. 4, it will be understood that multiple spray layers of magnetic field attenuation metal sprays and plane wave attenuation metal sprays may be applied and that the sequence of application of these sprays may be changed or alternated. For example, alternating layers of steel metal spray and tin metal spray may be used to form a thicker laminate of sprays to increase the durability and attenuation capability of the shield.

An example of an EMI/RFI shelter application configured for placement on the back of a truck or trailer is shown in FIG. 5. The shelter shown in FIG. 5 has a generally rectangular shape with left side-wall 54, right side-wall 56, bottom 58, top 60, front 62, and back 64. Indented sections 66 and 68 are present to allow the structure to fit over wheels or wheel wells on a truck or trailer. An access door 70 on the back wall 64 provides entry into the shelter.

In the example shown in FIG. 5, the side walls 54, 56, front and back walls 62, 64, top and bottom panels 60, 58 and door 70 are made from 6061-T6 aluminum skins bonded with adhesives to a perimeter 6061-T6 aluminum extrusion frame and a non-metallic honeycomb core having a thickness of approximately 1.21 inches with the overall panel thickness of approximately 1.26 inches. The panels are sized and welded together to make the shelter. The seams and any imperfections in the surfaces of the structural elements are filled with a metal impregnated epoxy filler.

After allowing the filler to cure, the excess filler is removed and the edges are smoothed and shaped. The surfaces are cleaned and a bond coat of molybdenum is applied followed by a coat of steel spray and then a coat of tin spray as described in FIG. 1 and FIG. 2A and FIG. 2B. All seams and permanent penetrations of the panels of the shelter are preferably treated with the process.

The embodiment of the present invention shown in FIG. 1, FIG. 2 and FIG. 5 will produce an EMI/RFI shield with the following typical minimum attenuation levels that will not substantially diminish over time:

156 KHz>60 db

16 MHz>90 db

400 MHz>93 db

1 GHz>85 db

10 GHz>85 db

Generally, during the metal spray steps of FIG. 1 and FIG. 2A and FIG. 2B, it is preferred that a visual inspection of each spray layer be conducted to insure that the metal spray does not overheat the bonding surfaces to the point of degrading the overall structure. Overheating could cause debonding of the sheet skin from the frame structure or honeycomb core, resulting in a structural and/or EMI/RFI deficiency or weak point that could degrade over time. In addition, exceeding the recommended ranges of layer thickness may result in the introduction of excessive tensile or compressive stresses within the metalized surfaces. Such stresses may lead to fatigue and fractures in the layered surfaces during use that may allow leaking of electromagnetic or radio frequency radiation.

It can be seen that the selection of metal sprays and dimensions shown in the examples above was made to provide minimal flexure in the bridges of metal spray in order to avoid fatigue stressing from road vibration, for example. Additionally, the materials that have been selected have closely matched thermal expansion coefficients to avoid temperature cycling type fatigue fractures.

While the materials and dimensions discussed above were selected for durability and performance in severe environmental conditions, other materials and dimensions with comparable characteristics may be used and the invention should not be limited to those materials and dimensions described herein. Still other materials and dimensions may be selected for applications where temperature, shock, vibrations, weather conditions are not of concern.

The present invention may be more particularly described in the following example that are intended for illustrative purposes only, since numerous modifications, adaptations and variations will be apparent to those skilled in the art.

Example 1

A lightweight multipurpose shelter, configured for placement on the back or frame of a truck, was produced using aluminum skin, hot bonded panels with a welded aluminum extrusion framework. The exterior dimensions of the shelter were 84 inches in width by 102 inches in length by 67 inches in height.

Extruded aluminum frame members were sized, cut and then welded together to create panel frame weldments. A honeycomb core material was placed into the frame weldments and properly dimensioned panels of aluminum sheets were sized, cut and hot bonded to both sides of the frame weldment/honeycomb core structure using film adhesive and core splice adhesive materials. The surfaces of the top, bottom, sides, front and back were prepared by removing all adhesive and core splice residue, as well as cleaning off the corrosion inhibiting primer from extruded frame members and the interior skin surface of the panel approximately ½" away from the bond line between the frame member and the interior skin. Care was taken to only remove a minimal amount of frame and panel interior skin material during this process. Any film adhesive and/or core splice material was cleaned out of any gaps between frame member and the interior skin by wire brushing gap until bare metal was exposed. The brushed surfaces were prepared by cleaning with isopropyl alcohol. Likewise, the interior doorframe perimeter where the skin meets the doorframe extrusion was wire brushed to remove all excess film adhesive in this area and the brushed surfaces were cleaned with alcohol.

Epoxy was injected into the seam gaps around the entire interior perimeter of the wall, floor and top and front and back panel joints insuring that sufficient material was used to completely fill the gaps. Similarly, a bead of epoxy was placed along the prepared perimeter of the interior doorframe to bridge the skin and the frame member.

After the epoxy cure, the excess epoxy material was sanded down until it was just flush with the panel's interior skin and frame surfaces for all of the seams. Corner fittings were installed at the bent wall panel corners and trimmed as necessary for a snug fit.

The assembled structure is loosely strapped with metal strapping and the panels were adjusted to insure the structure was square and had the proper dimensions. Overall tolerance dimensions were plus/minus ¼". The dimensions of shelter faces were recorded and the metal banding straps were tightened in preparation for tack welding.

The dimensions were verified and the exterior seams of the corners of the front and rear walls of the shelter were tack welded into position. The overall dimensions were adjusted and evenly spaced tack welds of no more than 18-inch separation between welds were performed along the seam perimeter of the shelter.

The entire exterior perimeter seams of the shelter were skip welded followed by skip welding of the interior perimeter seams. Rectangular wheel wells were then positioned and skip welded into place to the wall and floor panels. The corner fittings were then welded into place.

For all tack welding and subsequent skip welding, the surface temperature of the panel was monitored during welding to insure that the surface temperature of panel interior and exterior skins never exceed 225° F. through the use of heat sticks, pyrometers and other temperature monitoring equipment.

The welds were inspected and epoxy was injected into any remaining openings between the corner fittings and the shelter panels and other seams that could not be welded. After cure, the excess material was carefully removed by sanding, for example to blend between the corner fittings and the wall panel skins. The sanded surfaces were roughened and cleaned with isopropyl alcohol in preparation for metal spray.

All interior fasteners (potted inserts, threaded blind rivets for example) were installed and similarly prepared for metal spray by filling any gaps with epoxy and sanding flush to adjacent bare metal. Any openings or penetrations in the panels (the drain plug for example) were similarly drilled, sanded to bare metal and cleaned with isopropyl alcohol in preparation for metal spray. The interior surfaces were inspected and the interior seams, corners, drain plug opening, inserts and door frame were sprayed with a bond coat of molybdenum metal spray. After spray was removed by exposure of the panels and seams to filtered compressed air.

Within an hour, a 2 millimeter thick coat of high carbon steel was applied to the all interior seams and prepared surfaces of the shelter. Any after spray or other particulate contaminants from the ambient air were removed from the surface of the shelter through the use of filtered compressed air.

A topcoat of tin metal spray was applied to the sprayed surface of the seams and panels of the shelter within an hour of the application of the steel coat of metal spray. After the removal of overspray from the topcoat, the assembly of the shelter was completed in preparation for testing by installing the shelter door assembly, door strike plates, door gaskets, drain plug and related components.

Testing of the RFI shielding capability and structural integrity of the shelter was conducted in accordance with ASTM E1851-97, with the specific requirement that the signal effectiveness (attenuation) be greater than $20*\log(f)-60$ where f is the test frequency in Hz, and a minimum of 80 dB for frequencies greater than 10 MHz. Results demonstrated compliance with these requirements, a significant improvement over the current art. The structure demonstrated 2.0 pounds per square inch minimum blast overpressure capability and roof loads in excess of 40 pounds per square foot and 660 pounds over any 2 square foot area. Floor loads of 65 pounds per square foot uniform load with 1,000 pounds over any 2 square foot area and 125 pounds per square foot point load. The shelter also showed a U-Factor of 0.39 BTU/hr/sq.ft./° F.

Endurance testing showed that there was no degradation of the EMI/RFI shielding capability of the shelter over time and exposure to moisture and temperature extremes as well as transportation vibrations and shocks. Attenuation capability of the shelter of approximately 80 dB persisted through the length of the test and has remained constant over a period one and one-half years.

Accordingly, it will be seen that this invention provides a EMI/RFI shield and method that produces a shielded enclosure or shelter that does not degrade over time and is resistant to weather extremes and shock and vibrations from frequent transportation.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An enclosure shielded to electromagnetic and radio frequency interference, comprising:
   a top panel;
   a bottom panel;
   front, rear, left side and right side walls joined to said top panel and to said bottom panel said front and rear walls joined to said left and right walls configured to form an enclosure;
   electrically conductive filler disposed within joints between said walls and said panels; and
   a plurality of layers of metal spray coating said panels, walls and filled joints adapted to provide resistance to electromagnetic interference.

2. An enclosure as recited in claim 1, wherein said panels and walls comprise planar sheets having at least one surface comprising aluminum.

3. An enclosure as recited in claim 1, further comprising:
   a coating of paint to a top layer of metal spray.

* * * * *